(12) United States Patent
Hwang et al.

(10) Patent No.: US 8,026,990 B2
(45) Date of Patent: Sep. 27, 2011

(54) THIN FILM TRANSISTOR, METHOD OF RECOVERING PERFORMANCE OF THE SAME, AND LIQUID CRYSTAL DISPLAY EMPLOYING THE SAME

(75) Inventors: Tae-Hyung Hwang, Seoul (KR); Hyung-Il Jeon, Incheon (KR); Nikulin Ivan, Tula (RU)

(73) Assignee: Samsung Electronics Co., Ltd., Suwon-si (KR)

( * ) Notice: Subject to any disclaimer, the term of this patent is extended or adjusted under 35 U.S.C. 154(b) by 407 days.

(21) Appl. No.: 12/249,833

(22) Filed: Oct. 10, 2008

(65) Prior Publication Data
US 2009/0190057 A1  Jul. 30, 2009

(30) Foreign Application Priority Data
Jan. 24, 2008 (KR) .................. 10-2008-0007551

(51) Int. Cl.
G02F 1/136 (2006.01)
G02F 1/133 (2006.01)

(52) U.S. Cl. .................. 349/46; 349/33; 349/41; 349/42

(58) Field of Classification Search .................. 349/46
See application file for complete search history.

(56) References Cited

U.S. PATENT DOCUMENTS

| 7,683,669 | B2 * | 3/2010 | Koyama | 326/82 |
|---|---|---|---|---|
| 2005/0158929 | A1 * | 7/2005 | Yamazaki et al. | 438/166 |
| 2006/0232574 | A1 * | 10/2006 | Miyazawa | 345/204 |
| 2007/0001945 | A1 * | 1/2007 | Yoshida et al. | 345/87 |
| 2009/0101916 | A1 * | 4/2009 | Yamazaki et al. | 257/72 |
| 2009/0166631 | A1 * | 7/2009 | Yamazaki | 257/57 |

OTHER PUBLICATIONS

Chang-Wook Han, et al. "A substrate bias effect on the stability of a-Si:H TFT fabricated on a flexible metal substrate" IMID '07 Digest, pp. 257-260.

* cited by examiner

Primary Examiner — Michelle R Connelly Cushwa
(74) Attorney, Agent, or Firm — H.C. Park & Associates, PLC (57) ABSTRACT

A method of compensating performance of a thin film transistor including a gate electrode, source and drain electrodes that are spaced apart from each other and insulated from the gate electrode, and an active layer to form a channel between the source and drain electrodes, includes applying a negative voltage to the gate electrode to compensate deterioration of the active layer.

18 Claims, 7 Drawing Sheets

THIN FILM TRANSISTOR, METHOD OF RECOVERING PERFORMANCE OF THE SAME, AND LIQUID CRYSTAL DISPLAY EMPLOYING THE SAME

CROSS-REFERENCE TO RELATED APPLICATION

This application claims priority from and the benefit of Korean Patent Application No. 10-2008-0007551, filed on Jan. 24, 2008, which is hereby incorporated by reference for all purposes as if fully set forth herein.

BACKGROUND

1. Field of the Invention

The present invention relates to a thin film transistor, a method of compensating for performance deterioration of the thin film transistor, and a liquid crystal display including the thin film transistor.

2. Discussion of the Background

With the advent of information technologies, the demand for high-performance display apparatuses capable of displaying various types of information, such as videos, graphics, and characters, has increased. Therefore, the display industry has grown rapidly.

Particularly, because a liquid crystal display (LCD) may have low power consumption, may be slim and lightweight, and may suppress harmful electromagnetic waves as compared with a cathode ray tube, LCDs have become a next-generation high-technology display apparatus. In addition, LCDs have been extensively employed in various fields, such as electronic clocks, electronic calculators, personal computers, and television sets.

Recently, the need for a display apparatus to have improved portability has increased. Therefore, consumers may pursue a flexible display apparatus that can be folded or rolled.

Since plastic may be deformed in a high temperature environment, all processes are performed at temperatures lower than the glass transition temperature in order to manufacture a display apparatus including flexible plastic. However, when a thin film transistor is manufactured at a low temperature, the characteristics of the thin film transistor may be deteriorated.

SUMMARY OF INVENTION

The present invention provides a thin film transistor that may have improved performance.

The present invention also provides a method of compensating for performance deterioration of the thin film transistor.

The present invention also provides a liquid crystal display including the thin film transistor.

Additional features of the invention will be set forth in the description which follows, and in part will be apparent from the description, or may be learned by practice of the invention.

The present invention discloses a method of compensating for performance deterioration of a thin film transistor. The thin film transistor includes a gate electrode on an insulating substrate, a source electrode and a drain electrode that are spaced apart from each other and insulated from the gate electrode, and an active layer to form a channel between the source electrode and the drain electrode. The method includes applying a negative voltage in a range of −30 V to −50 V to the gate electrode.

The present invention also discloses a thin film transistor including an annealing electrode on an insulating substrate, a gate electrode insulated from and overlapping with the annealing electrode, a source electrode and a drain electrode insulated from the gate electrode, the source electrode being spaced apart from the drain electrode, and an active layer that forms a channel between the source electrode and the drain electrode. The annealing electrode applies a negative voltage to the gate electrode when power to the thin film transistor is turned off to compensate for performance deterioration of the active layer.

The present invention also discloses a liquid crystal display including a liquid crystal panel, a gate driving circuit, which is on the liquid crystal display panel and includes at least one thin film transistor, and negative voltage applier. The thin film transistor includes an annealing electrode on an insulating substrate, a gate electrode insulated from and overlapping with the annealing electrode, a source electrode and a drain electrode spaced apart from each other and insulated from the gate electrode, and an active layer that forms a channel between the source electrode and the drain electrode. The negative voltage applier applies a negative voltage to the annealing electrode when power to the liquid crystal display is turned off.

It is to be understood that both the foregoing general description and the following detailed description are exemplary and explanatory and are intended to provide further explanation of the invention as claimed.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A thin film transistor includes a gate electrode, source and drain electrodes insulated from the gate electrode, and an active layer forming a channel between the source electrode and the drain electrode. The performance of the thin film transistor may deteriorate according to the use thereof.

Figure 1:
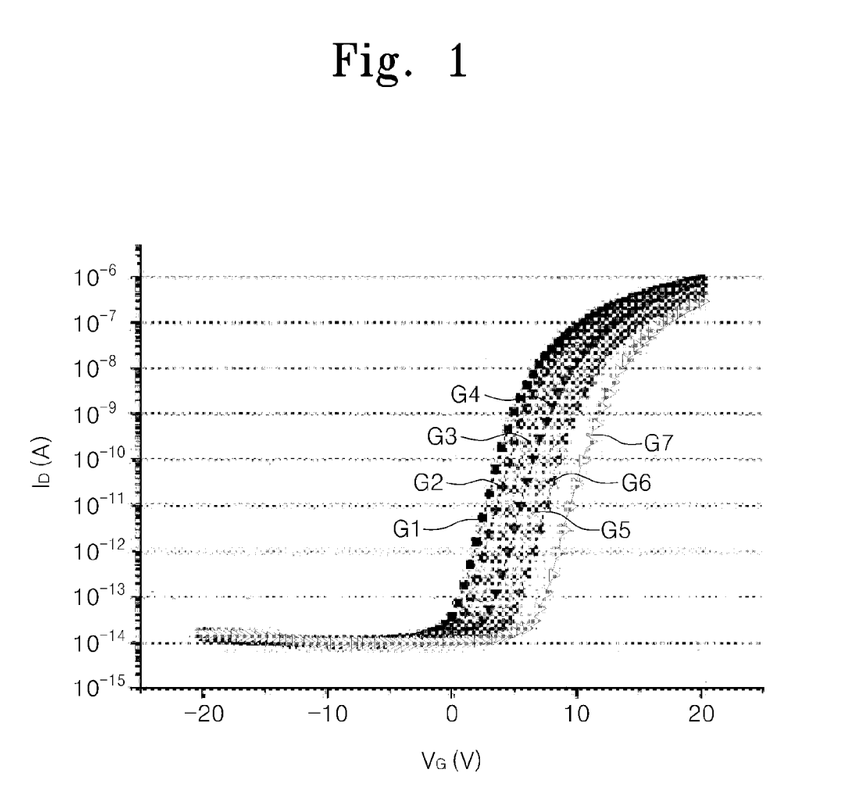
FIG. 1 is a graph showing deterioration of a thin film transistor according to a DC bias stress.

FIG. 1 is a graph showing deterioration of a thin film transistor according to a DC bias stress, and, particularly, showing the relationship between a gate voltage $V_G$ and a drain current $I_D$. The seven curves G1, G2, G3, G4, G5, G6, and G7 of FIG. 1 show the variation in the characteristics of the thin film transistor according to a function of time after bias stress (a gate-source voltage (Vgs) of about 20 V and a drain-source voltage of about 10 V) is applied for one hour. The curves respectively represent the relationship between the gate voltage $V_G$ and the drain current $I_D$ at an initial stage (G1), and after 10 (G2), 60 (G3), 160 (G4), 460 (G5), 960 (G6), and 3960 (G7) seconds have elapsed since application of the bias stress. The curves show that the drain current $I_D$ at a given gate voltage $V_G$ decreases with time after the bias stress is applied.

Since circuits of thin film transistors used in a single display apparatus may be exposed to different stress environments, the characteristics of the thin film transistors may deteriorate to different degrees.

The performance deterioration of the thin film transistors according to the use thereof and the difference in the performance deterioration between the thin film transistors may greatly degrade the display quality of the display apparatus.

Exemplary embodiments of the present invention suggest a method of compensating for performance deterioration of the thin film transistor. In the method of compensating for performance deterioration of the thin film transistor according to the exemplary embodiments of the present invention, a negative voltage is applied to the gate electrode when a display apparatus is powered off, so that the negative voltage is applied to an active layer. Accordingly, the performance deterioration of the thin film transistor, more specifically, the performance deterioration of the active layer may be compensated for. When the thin film transistor is driven, a threshold voltage may gradually increase due to the stress of a positive gate bias exerted on the active layer. In this case, a negative voltage is applied to the gate electrode so that stress having opposite polarity to the stress of the positive gate bias is exerted on the active layer, thereby lowering the threshold voltage. The performance deterioration of the thin film transistor may be compensated for by applying the negative voltage to the active layer because the application of the negative voltage to the active layer may remove dangling bonds generated on the active layer due to the positive gate bias.

Figure 2:
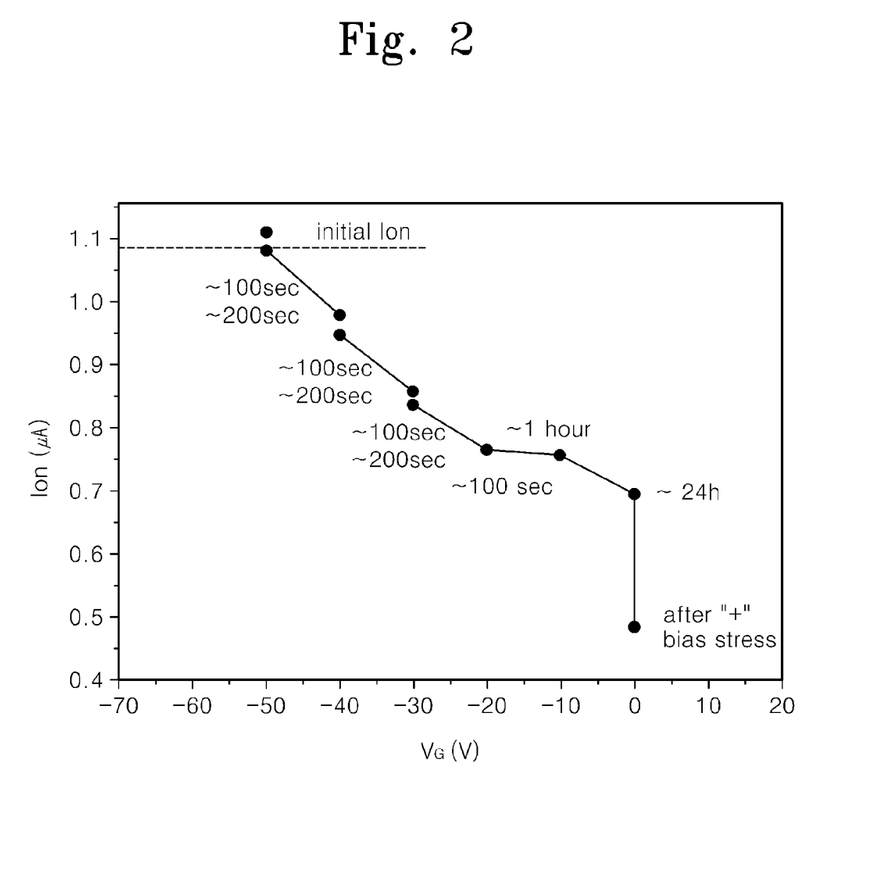
FIG. 2 and FIG. 3 are graphs showing the performance of a thin film transistor according to a negative voltage applied to a gate electrode.

FIG. 2 is a graph showing the performance of a thin film transistor according to a negative voltage applied to the gate electrode, and particularly, showing the variation of an on-current Ion of the thin film transistor when a voltage in the range of about 0 V to about −50 V is applied to the gate electrode of the thin film transistor.

An initial on-current Ion is marked by a dotted line at the left upper portion of the graph, and first, second, and third on-currents are sequentially shown from the right lower portion of the graph, in which the first on-current represents an on-current Ion after DC bias stress is applied for one hour (expressed as "after + bias stress" in FIG. 2), the second on-current represents an on-current Ion when the DC bias stress is applied for 24 hours, and the third on-current represents an on-current Ion when negative voltages of −10V, −20V, −30V, −40V, and −50V are applied to the gate electrode after the DC bias stress is applied. In this case, the third on-current represents the on-current after the negative voltage of −10V or −20V is applied for one hour or 100 seconds, respectively, or represents the on-current after the negative voltages of −30V, −40V, or −50V are applied for time in the range of 100 seconds to 200 seconds. After the thin film transistor having the initial on-current Ion of 1.07 µA receives DC bias stress for one hour, the on-current Ion is lowered to 0.48 µA showing the characteristic deterioration of the thin film transistor. However, the on-current Ion is raised to 0.85 µA, 097 µA, or 1.09 µA when a negative voltage of −30V, −40V, or −50V is applied for 200 seconds, that is, the on-current Ion returns to an original state thereof.

Figure 3:
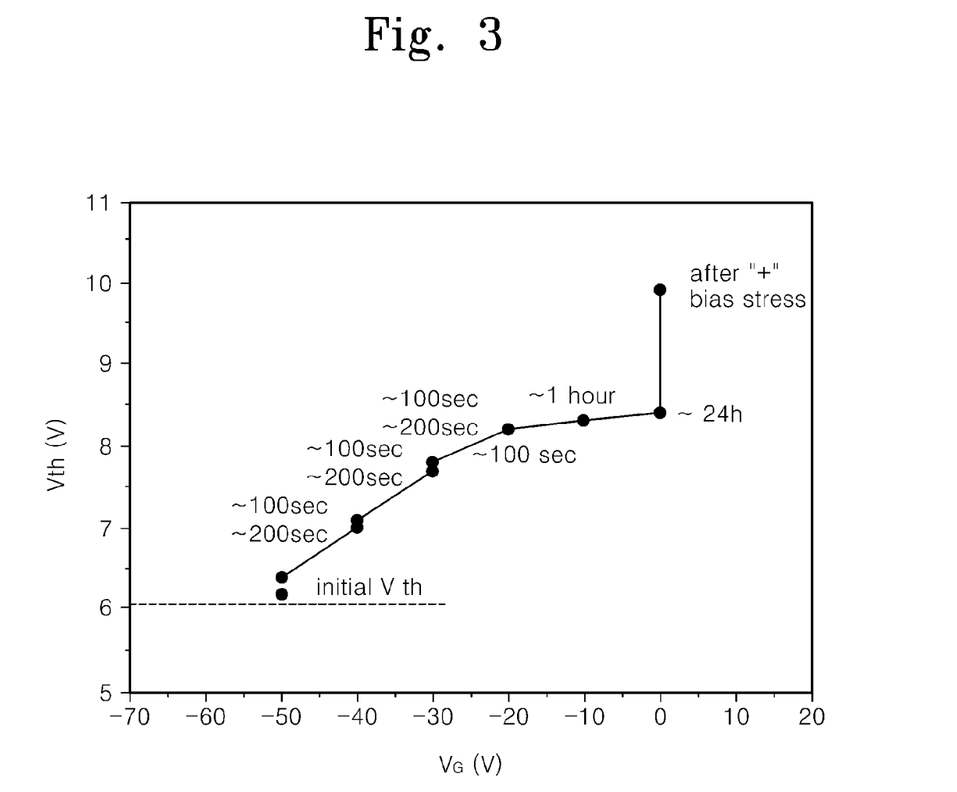

FIG. 3 is a graph showing the performance of a thin film transistor according to a negative voltage applied to the gate electrode, and particularly, showing the characteristic variation of a threshold voltage Vth of the thin film transistor when a voltage in the range of about 0 V to about −50 V is applied to the gate electrode of the thin film transistor.

An initial threshold voltage is marked by a dotted line at the left lower portion of the graph, and first, second, and third threshold voltages are sequentially shown from the right upper portion of the graph, in which the first threshold voltage represents a threshold voltage after DC bias stress is applied for one hour (expressed as "after + bias stress" in FIG. 3), the second threshold voltage represents a threshold voltage after the DC bias stress has been applied for 24 hours, and the third threshold voltage represents a threshold voltage when negative voltages of −10V, −20V, −30V, −40V, and −50V are applied to the gate electrode after the DC bias stress is applied. In this case, the third threshold voltage represents a threshold voltage after a negative voltage of −10V or −20V is applied for one hour or 100 seconds, respectively, or represents the threshold voltage after a negative voltage of −30V, −40V, or −50V is applied for about 100 seconds to about 200 seconds.

Although the initial threshold voltage is raised from 6.1 V to 9.9 V after the DC bias stress is applied for one hour, thereby showing the deterioration of the thin film transistor, the threshold voltage is lowered to 7.6V, 6.9V, or 6.2V when a negative voltage of −30V, −40V, or −50V is applied for 200 seconds, that is, the threshold voltage returns to an initial state thereof.

As shown in FIG. 2 and FIG. 3, a negative voltage is applied to the gate electrode in a power-off state such that a negative voltage is applied to the active layer, thereby compensating the performance deterioration of the thin film transistor. When taking into account the compensation of the performance of the thin film transistor, a negative voltage in the range of about −30 V to about −50 V may be applied to the gate electrode. As shown in FIG. 1, even though an off voltage is continuously decreased in a thin film transistor manufactured under the low temperature, an off current does not increase. Accordingly, even if a negative voltage of about −30 V to about −50 V is applied, the display apparatus may not have driving related problems.

Figure 4:
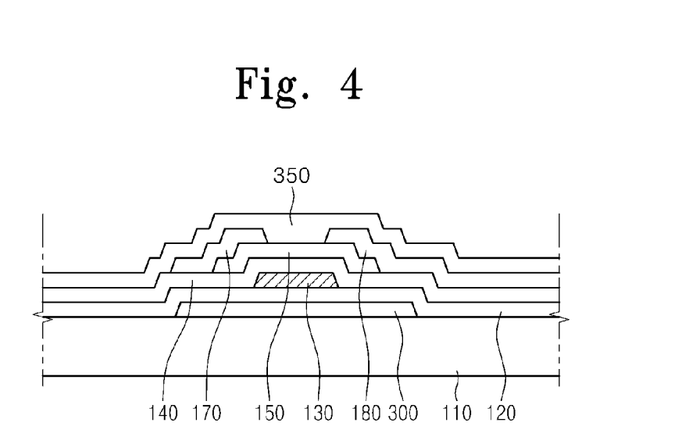
FIG. 4 is a sectional view showing a thin film transistor according to an exemplary embodiment of the present invention.

FIG. 4 is a sectional view showing a thin film transistor according to an exemplary embodiment of the present invention. Hereinafter, the thin film transistor according to the present exemplary embodiment will be described with reference to FIG. 4.

The thin film transistor according to the present exemplary embodiment includes an insulating substrate 110, an annealing electrode 300, a gate electrode 130, source and drain electrodes 170 and 180 that are spaced apart from each other and insulated from the gate electrode 130, and an active layer 150.

The annealing electrode 300 is formed on the insulating substrate 110. The annealing electrode 300 applies a negative voltage to the gate electrode 130, which is described below. For example, the annealing electrode 300 may include a metallic layer, such as a copper (Cu) layer, a molybdenum (Mo) layer, an aluminum (Al) layer, a copper (Cu) alloy layer, a molybdenum (Mo) alloy layer, or an aluminum (Al) alloy layer.

The gate electrode 130 is insulated from and overlaps with the annealing electrode 300. For example, the gate electrode 130 may include a metallic layer, such as a copper (Cu) layer, a molybdenum (Mo) layer, an aluminum (Al) layer, a copper (Cu) alloy layer, a molybdenum (Mo) alloy layer, or an aluminum (Al) alloy layer. In order to insulate the gate electrode 130 from the annealing electrode 300, an insulating layer 120 is formed on the annealing electrode 300, and the gate electrode 130 is formed on the insulating layer 120.

The active layer 150 is insulated from and overlaps with the gate electrode 130, such that a channel is formed between the source electrode 170 and the drain electrode 180. The active layer 150 may include a first semiconductor layer including amorphous silicon and a second semiconductor layer including amorphous silicon doped with impurities. A gate insulating layer 140 is formed on the gate electrode 130 to insulate the active layer 150 from the gate electrode 130, and the active layer 150 is formed on the gate insulating layer 140.

The source electrode 170 and the drain electrode 180 are spaced apart from each other and insulated from the gate electrode 130. As described above, the active layer 150 forms a channel between the source electrode 170 and the drain electrode 180. For example, the source electrode 170 and the drain electrode 180 may include a metallic layer, such as a copper (Cu) layer, a molybdenum (Mo) layer, an aluminum (Al) layer, a copper (Cu) alloy layer, a molybdenum (Mo) alloy layer, or an aluminum (Al) alloy layer. The source electrode 170 and the drain electrode 180 are floated when the display apparatus is powered off to generate an electric field with the annealing electrode 300 to which a negative voltage is applied. A negative voltage is applied to the gate electrode 130 and the active layer 150 by the electric field formed between the annealing electrode 300 and the source and drain electrodes 170 and 180. Accordingly, degradation of the active layer 150, which may be caused by a positive gate bias when the thin film transistor is driven, may be compensated for.

A protective layer 350, which may include silicon oxide or silicon nitride, is formed on the source electrode 170 and the drain electrode 180 to protect the thin film transistor.

Figure 5:
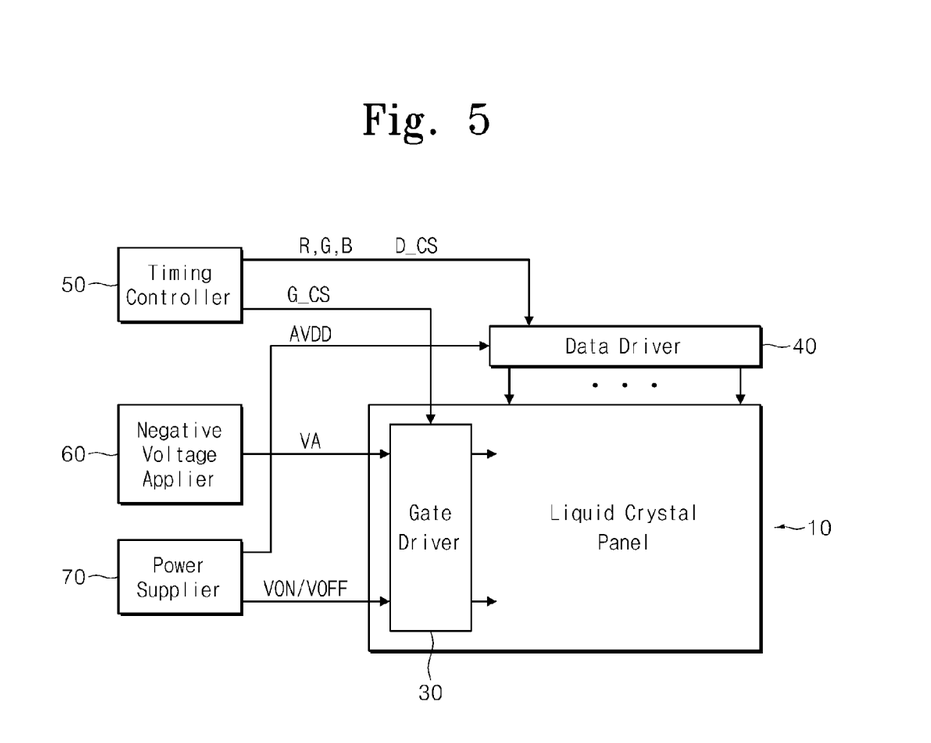
FIG. 5 is a block diagram showing a liquid crystal display according to an exemplary embodiment of the present invention.

FIG. 5 is a block diagram showing a liquid crystal display provided with an amorphous silicon gate driver including the thin film transistor of FIG. 4 according to an exemplary embodiment of the present invention. The liquid crystal display according to the present exemplary embodiment will be described with reference to FIG. 5.

The liquid crystal display according to the present exemplary embodiment includes a liquid crystal panel 10, a gate driver 30, a data driver 40, a timing controller 50, a power supplier 70, and a negative voltage applier 60.

The timing controller 50 generates a gate control signal G_CS and a data control signal D_CS such that the gate control signal G_CS and the data control signal D_CS are supplied to the gate driver 30 and the data driver 40, respectively. The timing controller 50 converts red, green, and blue image signals provided from an exterior into pixel data signals R, G, and B, and transfers the pixel data signals R, G, and B to the data driver 40.

The data driver 40 converts the pixel data signals R, G, and B into an analog data voltage in response to the data control signal D_CS applied from the timing controller 50 so that the analog data voltage is supplied to a data line DL. The gate driver 30 applies a gate on voltage VON or a gate off voltage VOFF onto a gate line of the liquid crystal panel 10 in response to the gate control signal G_CS.

The negative voltage applier 60 generates an annealing voltage VA, which is a negative voltage, and applies the annealing voltage VA to a plurality of thin film transistors constituting the gate driver 30. In this case, the negative voltage applier 60 supplies the negative voltage when the liquid crystal display is off. In other words, if a termination signal of the liquid crystal display is applied, the data control signal D_CS and the data signals R, G, and B supplied to the data driver 40 are cut off according to the sequence of power supply, and the gate control signal G_CS, which allows the gate off voltage VOFF to be output, is supplied to the gate driver 30. Then, after the gate off voltage VOFF is cut off, the annealing voltage VA is supplied to the gate driver 30 from the negative voltage applier 60.

Meanwhile, when the display apparatus is powered off, the source electrode 170 and the drain electrode 180 of the thin film transistor are floated to form an electric field with the annealing electrode 300, to which the negative voltage is applied. A negative voltage is applied between the gate electrode 130 and the active layer 150 due to the electric field formed between the annealing electrode 300 and the source and drain electrodes 170 and 180. Accordingly, the threshold voltage, which was increased due to the stress of a positive gate bias exerted on the active layer 150 when the thin film transistor is driven, may be reduced.

The power supplier 70 supplies the gate on/off voltage VON/VOFF to the gate driver 30 and supplies an analog voltage AVDD to the data driver 40.

The liquid crystal panel 10 includes a first substrate with a pixel electrode formed thereon, a second substrate with a common electrode formed thereon, and a liquid crystal layer disposed between the first and second substrates. Signals from the data driver 40 and the gate driver 30 are transmitted to pixels of the liquid crystal panel 10, thereby driving the liquid crystal panel 10.

FIG. 6A, FIG. 6B, FIG. 6C, FIG. 6D, FIG. 6E, and FIG. 6F are process views showing a manufacturing method of the thin film transistor according to an exemplary embodiment of the present invention. The manufacturing method of the thin film transistor according to the present embodiment will be described with reference to FIG. 6A, FIG. 6B, FIG. 6C, FIG. 6D, FIG. 6E, and FIG. 6F.

Figure 6A:
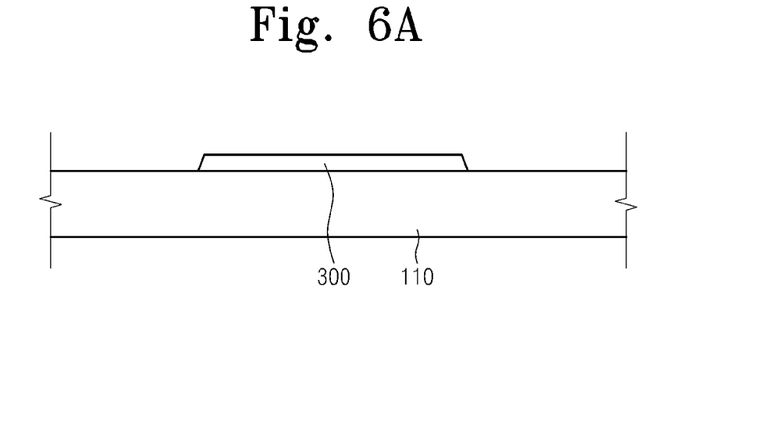
FIG. 6A, FIG. 6B, FIG. 6C, FIG. 6D, FIG. 6E, and FIG. 6F are process views showing a manufacturing method of a thin film transistor according to an exemplary embodiment of the present invention.

First, the annealing electrode 300 is formed on the insulating substrate 110 (see FIG. 6A).

A conductive layer may be formed on the insulating substrate 110 through a sputtering scheme. Next, the conductive layer may be etched through a photolithography process to form an annealing electrode 300. The annealing electrode 300 may include a metallic layer, such as a copper (Cu) layer, a molybdenum (Mo) layer, an aluminum (Al) layer, a copper (Cu) alloy layer, a molybdenum (Mo) alloy layer, or an aluminum (Al) alloy layer.

Figure 6B:
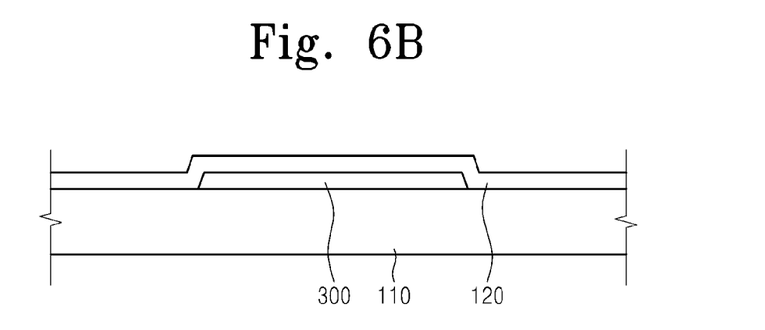

An insulating layer 120 is formed on the annealing electrode 300 (see FIG. 6B).

The insulating layer 120 covers the entire surface of the annealing electrode 300. The insulating layer 120 may include inorganic insulating materials, such as silicon oxide or silicon nitride, and may be deposited through chemical vapor deposition (CVD) or plasma enhanced chemical vapor deposition (PECVD).

Figure 6C:
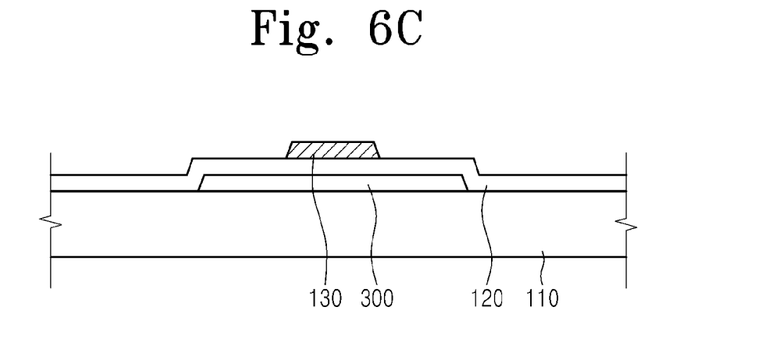

Next, the gate electrode 130 is formed on the insulating layer 120 (see FIG. 6C).

A conductive layer may be formed on the insulating substrate 110, on which the annealing electrode 300 and the insulating layer 120 are formed, through a sputtering method. Next, the conductive layer is etched through a photolithography process, thereby forming the gate electrode. The gate electrode 130 may include a metallic layer, such as a copper (Cu) layer, a molybdenum (Mo) layer, an aluminum (Al) layer, a copper (Cu) alloy layer, a molybdenum (Mo) alloy layer, or an aluminum (Al) alloy layer.

Figure 6D:
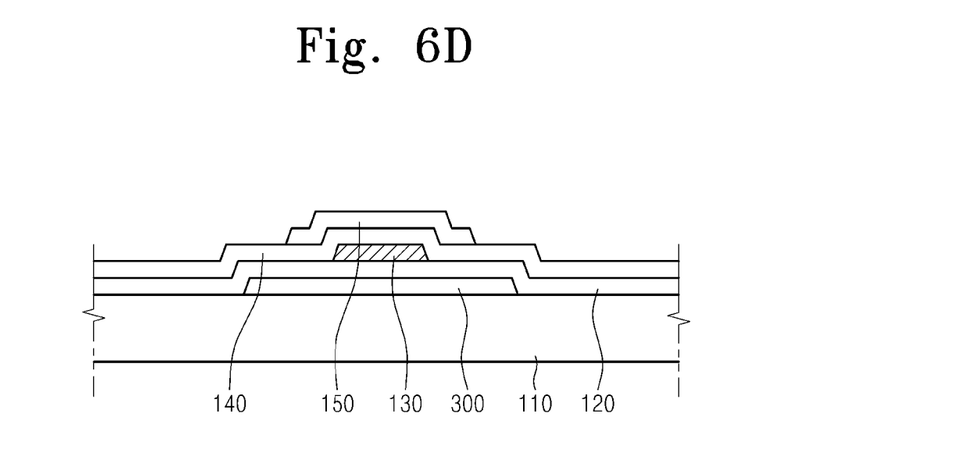

Subsequently, a gate insulating layer 140 and an active layer 150 are formed on the gate electrode 130 (see FIG. 6D).

An insulating layer and a semiconductor layer are stacked on the insulating substrate 110 including the gate electrode 130 through a PECVD process or a CVD process. Next, the insulating layer and the semiconductor layer may be etched through a photolithography process to form the gate insulating layer 140 and the active layer 150. The gate insulating layer 140 may include silicon oxide or silicon nitride. Meanwhile, the active layer 150 may include a first semiconductor layer including amorphous silicon and a second semiconductor layer including amorphous silicon doped with impurities.

For example, the active layer 150 may be stacked through a PECVD process using high-frequency power of about 150 W to about 300 W at a temperature of about 100° C. to about 180° C. When a flexible substrate, such as a plastic substrate, is used, the active layer 150 is formed at a low temperature, as described above, since the thin film transistor should be manufactured at a temperature lower than the glass transition temperature Tg of the substrate. However, when the active layer 150 is formed at a lower temperature, the active layer 150 may become unstable, so that the performance of the thin film transistor may deteriorate as the thin film transistor is used more and more. Therefore, in a thin film transistor according to the present exemplary embodiment, the performance deterioration of the active layer 150 is compensated for so that the life span of the thin film transistor may be improved.

Figure 6E:
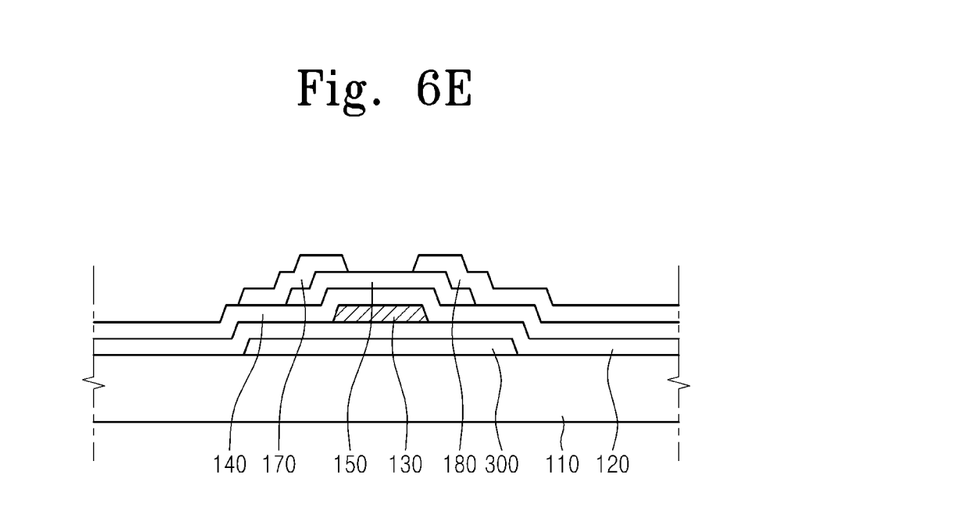

Referring to FIG. 6E, the source electrode 170 and the drain electrode 180 are formed on the active layer 150.

A conductive layer may be formed on the insulating substrate 110, which includes the active layer 150, through a sputtering method. Thereafter, the conductive layer may be etched through a photolithography process to form a source electrode 170 and a drain electrode 180. For example, the source electrode 170 and the drain electrode 180 may each include a metallic layer, such as a copper (Cu) layer, a molybdenum (Mo) layer, an aluminum (Al) layer, a copper (Cu) alloy layer, a molybdenum (Mo) alloy layer, or an aluminum (Al) alloy layer.

Figure 6F:
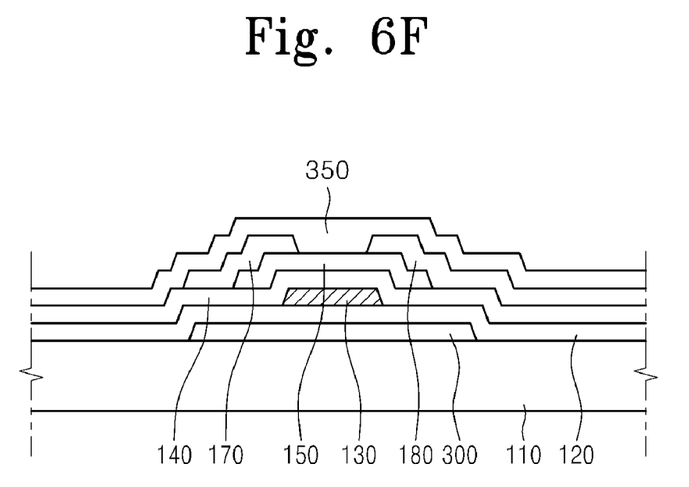

As shown in FIG. 6F, a protective layer 350 is formed on the source and drain electrodes 170 and 180.

A silicon oxide layer or a silicon nitride layer is formed on the insulating substrate 110 formed with the source electrode 170 and the drain electrode 180. The silicon oxide layer or the silicon nitride layer may be etched through a photolithography process, thereby forming the protective layer 350. A contact hole (not shown) is formed in the protective layer 350 to expose the drain electrode 180 such that the drain electrode 180 may contact an external circuit.

The above-described manufacturing method is described for one thin film transistor. However, in the driving of an amorphous silicon gate (ASG) in which the gate driver 30 is integrated with the liquid crystal panel 10, the layers of thin film transistors to drive the gate driver and pixel thin film transistors that are the same may be manufactured through a single process.

Exemplary embodiments of the present invention have been described in relation to the liquid crystal display as one example, but the exemplary embodiments of the present invention are also adaptable to an organic light emitting display or an electrophoresis display.

As described above, the performance deterioration of the thin film transistor may be compensated for, so that the quality of the liquid crystal display including the thin film transistor may be improved.

Although a thin film transistor of a flexible display apparatus manufactured at a lower temperature may have performance deterioration, the quality of the flexible display apparatus may be greatly improved by utilizing the method of compensating for the performance deterioration of the thin film transistor.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of compensating for performance deterioration of a thin film transistor for a display apparatus, which comprises a gate electrode, a source electrode and a drain electrode that are spaced apart from each other and insulated from the gate electrode, an active layer to form a channel between the source electrode and the drain electrode, and an annealing electrode insulated from the gate electrode, the method comprising:
   receiving a termination signal in response to the display apparatus being powered off;
   in response to the termination signal, applying a second negative voltage to the annealing electrode, thereby applying a first negative voltage in a range of −30 V to −50 V to the gate electrode to compensate for performance deterioration of the active layer.

2. The method of claim 1, wherein the source electrode and the drain electrode are floated when the display apparatus is powered off.

3. The method of claim 1, wherein the annealing electrode comprises at least one selected from the group consisting of copper (Cu), molybdenum (Mo), aluminum (Al), a copper (Cu) alloy, a molybdenum (Mo) alloy, and an aluminum (Al) alloy.

4. The method of claim 1, wherein the thin film transistor drives an amorphous silicon gate of the display apparatus.

5. The method of claim 1, further comprising forming the thin film transistor on a flexible substrate at a temperature lower than a glass transition substrate.

6. The method of claim 1, further comprising:
   in response to the termination signal, arranging that data control signals and gate control signals are cut off from the thin film transistor.

7. The method of claim 1, wherein the annealing electrode is formed on a flexible insulating substrate made of plastic, and the thin film transistor is formed at a temperature lower than a glass transition temperature of the plastic.

8. A thin film transistor for a display device, comprising:
   an annealing electrode on an insulating substrate;
   a gate electrode insulated from and overlapping with the annealing electrode;
   a source electrode and a drain electrode insulated from the gate electrode, the source electrode being spaced apart from the drain electrode; and
   an active layer that forms a channel between the source electrode and the drain electrode,
   wherein the annealing electrode is configured to receive a second negative voltage to compensate for performance deterioration of the active layer in response to the display apparatus being powered off.

9. The thin film transistor of claim 8, wherein the gate electrode is configured to receive a first negative voltage due to the second negative voltage being received at the annealing electrode.

10. The thin film transistor of claim 9, wherein the source electrode and the drain electrode are configured to be floated in response to the thin film transistor being turned off.

11. The thin film transistor of claim 10, wherein the first negative voltage is in a range of −30 V to −50 V.

12. The thin film transistor of claim 8, wherein the annealing electrode comprises at least one selected from the group consisting of copper (Cu), molybdenum (Mo), aluminum (Al), a copper (Cu) alloy, a molybdenum (Mo) alloy, and an aluminum (Al) alloy.

13. The thin film transistor of claim 8, wherein the thin film transistor is configured to drive an amorphous silicon gate of the display apparatus.

14. A liquid crystal display, comprising:
   a liquid crystal panel;
   a gate driving circuit on the liquid crystal display panel, the gate driving circuit comprising at least one thin film transistor, the thin film transistor comprising:
      an annealing electrode on an insulating substrate,
      a gate electrode insulated from and overlapping with the annealing electrode,
      a source electrode and a drain electrode spaced apart from each other and insulated from the gate electrode, and
      an active layer that forms a channel between the source electrode and the drain electrode; and
   a negative voltage applier to apply a second negative voltage to the annealing electrode, wherein the annealing electrode is configured to receive the second negative voltage in response to a termination signal to turn off the liquid crystal display.

15. The liquid crystal display of claim 14, wherein the active layer configured to receive a third negative voltage due to the second negative voltage being received at the annealing electrode.

16. The liquid crystal display of claim 14, wherein the source electrode and the drain electrode are configured to be floated in response to the liquid crystal display being turned off.

17. The liquid crystal display of claim 14, wherein the gate electrode configured to receive a first negative voltage in a range of −30 V to −50 V in response to the liquid crystal display being turned off.

18. The liquid crystal display of claim 14, wherein the annealing electrode comprises at least one selected from the group consisting of copper (Cu), molybdenum (Mo), aluminum (Al), a copper (Cu) alloy, a molybdenum (Mo) alloy, and an aluminum (Al) alloy.

* * * * *